United States Patent
Fujii

(10) Patent No.: US 11,107,887 B2
(45) Date of Patent: Aug. 31, 2021

(54) SEMICONDUCTOR DEVICE

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/441,366

(22) Filed: Jun. 14, 2019

(65) Prior Publication Data

US 2020/0111869 A1    Apr. 9, 2020

(30) Foreign Application Priority Data

Oct. 4, 2018    (JP) .............................. JP2018-189414

(51) Int. Cl.
*H01L 29/06* (2006.01)
*H01L 29/08* (2006.01)
*H01L 29/868* (2006.01)
*H01L 29/739* (2006.01)

(52) U.S. Cl.
CPC ...... *H01L 29/0696* (2013.01); *H01L 29/0821* (2013.01); *H01L 29/0834* (2013.01); *H01L 29/7395* (2013.01); *H01L 29/868* (2013.01)

(58) Field of Classification Search
None
See application file for complete search history.

(56) References Cited

U.S. PATENT DOCUMENTS

| 2010/0025827 | A1 | 2/2010 | Fujii | |
| 2010/0140658 | A1* | 6/2010 | Koyama | H01L 29/861 257/140 |
| 2015/0132895 | A1* | 5/2015 | Kamijo | H01L 29/7397 438/138 |
| 2015/0249084 | A1* | 9/2015 | Oki | H01L 29/7397 257/140 |
| 2016/0260703 | A1* | 9/2016 | Nakamura | H01L 29/407 |
| 2018/0019131 | A1* | 1/2018 | Suzuki | H01L 21/283 |

FOREIGN PATENT DOCUMENTS

JP    5309360 B2    10/2013

* cited by examiner

*Primary Examiner* — Jay C Chang
(74) *Attorney, Agent, or Firm* — Studebaker & Brackett PC

(57) ABSTRACT

A semiconductor device includes: an n-type semiconductor substrate having a cell region and a termination region provided around the cell region; a p-type anode layer provided on an upper surface of the n-type semiconductor substrate in the cell region; an n-type buffer layer provided on a lower surface of the n-type semiconductor substrate; and a p-type layer provided on the lower surface of the n-type buffer layer in the termination region and deeper than the n-type buffer layer.

10 Claims, 3 Drawing Sheets

SEMICONDUCTOR DEVICE

BACKGROUND OF THE INVENTION

Field

The present invention relates to a semiconductor device.

Background

In contemporary power semiconductor devices, thin wafer configurations are mainly used to reduce loss. Such thin wafer power semiconductor devices are produced by forming a diffusion layer on a wafer surface by dopant injection and heat treatment and then grinding the wafer to a desired thickness from the back surface. Thereafter, an n-type buffer layer is formed on the wafer back surface by proton injection or the like, and then a high-concentration n$^+$-type layer is formed on the backmost surface (see, for example, Japanese Patent No. 5309360).

SUMMARY

In a semiconductor device of an avalanche structure in the substrate thickness direction, as the substrate thickness is reduced to improve performance, a secondary breakdown current is more likely to flow and breakdown resistance decreases. A particular problem is that a local breakdown effect (single event burnout (SEB)) or the like is likely to occur under cosmic ray irradiation.

The present invention has been accomplished to solve the above-described problem, and it is an object of the present invention to provide a semiconductor device in which the breakdown resistance can be increased.

A semiconductor device according to the present invention includes: an n-type semiconductor substrate having a cell region and a termination region provided around the cell region; a p-type anode layer provided on an upper surface of the n-type semiconductor substrate in the cell region; an n-type buffer layer provided on a lower surface of the n-type semiconductor substrate; and a p-type layer provided on the lower surface of the n-type buffer layer in the termination region and deeper than the n-type buffer layer.

In the present invention, the p-type layer, which is deeper than the n-type buffer layer, is provided on the lower surface of the n-type semiconductor substrate in the termination region. As a result, even when the secondary breakdown current flows locally under the effect of high-energy cosmic rays, a secondary breakdown occurs between the main junction of the cell region of the upper surface of the substrate and the p-type layer of the termination region of the lower surface of the substrate. Therefore, since the secondary breakdown current flows in the oblique direction across the substrate thickness, the current path becomes longer, negative resistance is unlikely to appear, and the breakdown resistance can be increased.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
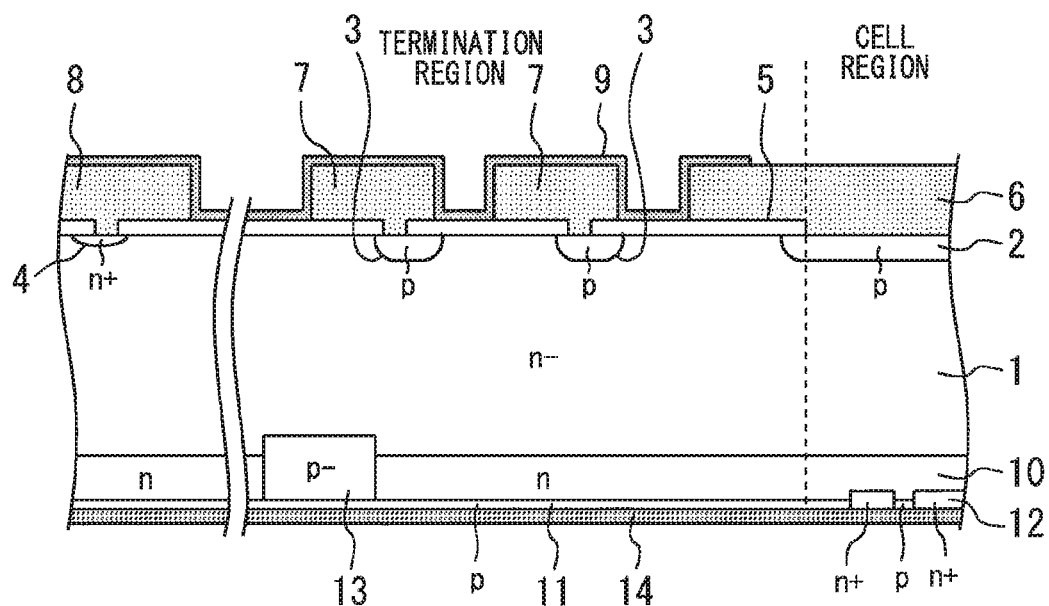
FIG. 1 is a cross-sectional view illustrating the semiconductor device according to the first embodiment.

FIG. 1 is a cross-sectional view illustrating the semiconductor device according to the first embodiment. An n$^-$-type semiconductor substrate 1 has a cell region and a termination region provided around the cell region. Further, the n$^-$-type semiconductor substrate 1 functions as an n-type drift layer.

A p-type anode layer 2 is provided on the upper surface of the n$^-$-type semiconductor substrate 1 in the cell region. A plurality of p-type layers 3 is provided on the upper surface of the n$^-$-type semiconductor substrate 1 in the termination region. An n$^+$-type layer 4 is provided on the upper surface of the n$^-$-type semiconductor substrate 1 in the outermost peripheral portion of the termination region.

An insulating film 5 is provided on the n$^-$-type semiconductor substrate 1. Openings are provided in the insulating film 5 above the p-type anode layer 2, the p-type layers 3, and the n$^+$-type layer 4. Upper surface electrodes 6, 7, and 8 are connected to the p-type anode layer 2, the p-type layers 3, and the n$^+$-type layer 4, respectively. The outer peripheral portion of the upper surface electrode 6 and the upper surface electrodes 7 and 8 are covered by a surface protective film 9.

In the cell region and the termination region, the n-type buffer layer 10 is provided on the lower surface of the n$^-$-type semiconductor substrate 1, and a p-type collector layer 11 is provided on the lower surface of the n-type buffer layer 10. In the cell region, a high-concentration n$^+$-type cathode layer 12 for causing the device to operate as a pin diode is provided on the lower surface of the n-type buffer layer 10. The p-type collector layer 11 and the n$^+$-type cathode layer 12 have a depth from the lower surface of the substrate less than that of the n-type buffer layer 10. As a result, a relaxed field of cathode (RFC) diode or an RC-IGBT having a pn pattern is formed on the lower surface of the substrate. By forming the pn pattern on the back surface, it is possible to suppress oscillations at the time of recovery in the RFC diode and form an IGBT and a diode in one chip in the RC-IGBT. The p-type collector layer 11 in the cell region is provided to increase resistance to recovery oscillations. The p-type collector layer 11 in the termination region is provided to increase a safe operating area (SOA).

A p$^-$-type layer 13, which is deeper than the n-type buffer layer 10, is provided on the lower surface of the n$^-$-type semiconductor substrate 1 in the termination region. The pn junction of the p-type anode layer 2 and the n$^-$-type semiconductor substrate 1 is the main junction in the cell region of the upper surface of the substrate. The concentration, depth, and position in the termination region of the p$^-$-type layer 13 are set such that the secondary breakdown occurs between the deep p$^-$-type layer 13 of the termination region of the lower surface of the substrate and the main junction of the cell region of the upper surface of the substrate. The p⁻-type layer 13 is connected to the lower surface electrode 14. Therefore, the secondary breakdown current can be discharged to the back surface electrode by pap bipolar operation of the p-type anode layer 2, the n⁻-type semiconductor substrate 1, and the p-type collector layer 11.

A method for producing the semiconductor device according to the present embodiment will be described hereinbelow. Initially, a cell structure and a termination structure are formed on the substrate surface by a combination of photolithography, dopant injection, and diffusion process. The cell structure is an anode in a diode and a MOS structure in an IGBT. Then, the upper surface electrodes 6, 7, and 8 and the surface protective film 9 are formed.

The n⁻-type semiconductor substrate 1 is then ground from the back surface to the desired thickness. The deep p⁻-type layer 13 is formed by irradiation or injection of the substrate back surface side of the termination region with helium or boron at about 100 MeV by using a photolithography process or a shielding mask. In FIG. 1, the p⁻-type layer 13 is formed partially in the termination region, but this layer may be formed to reach the chip side surface.

Then, the n-type buffer layer 10 is formed by irradiation or injection of the entire back surface of the substrate with protons or phosphorus at about 100 MeV. The dopant is also injected in the p⁻-type layer 13, but is canceled by a difference in concentration. The p⁻-type layer 13 and the n-type buffer layer 10 are activated by performing heat treatment such as laser annealing. When the p⁻-type layer 13 is formed even deeper, heat treatment can be also performed separately.

The p-type collector layer 11 is then formed by ion implantation of boron at several tens of keV and 1E12 to 1E15/cm² into the lowermost surface of the substrate. The n⁺-type cathode layer 12 is formed by ion implantation of phosphorus or arsenic at several tens of keV and 1E14 to 1E17/cm² by using a mask patterned by photolithography, and then activation by heat treatment such as laser annealing.

Figure 2:
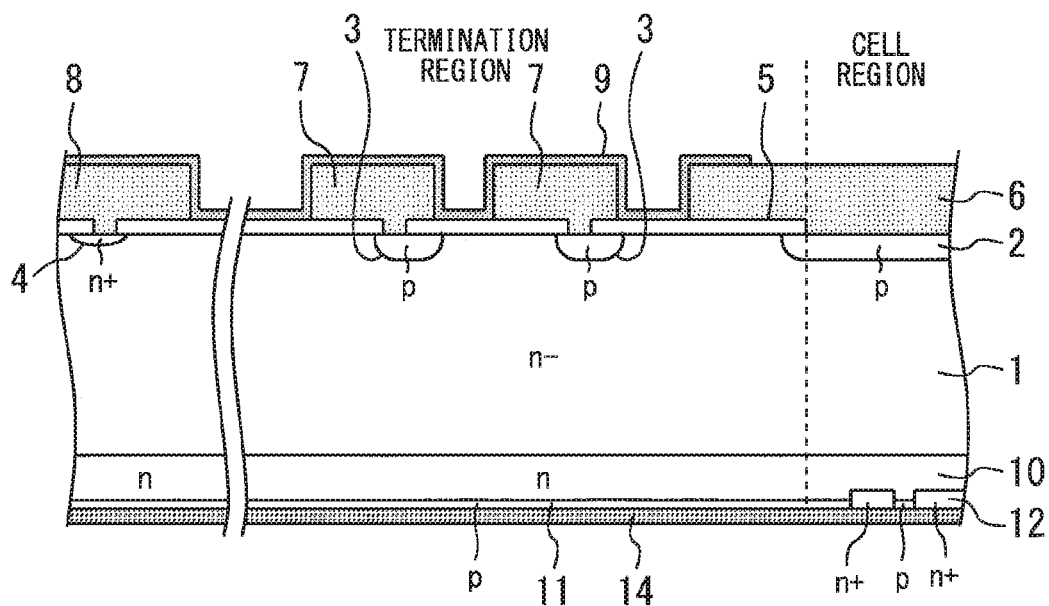
FIG. 2 is a cross-sectional view showing a semiconductor device according to the comparative example.

The effect of the present embodiment will be hereinbelow explained in comparison with a comparative example. FIG. 2 is a cross-sectional view showing a semiconductor device according to the comparative example. In the comparative example, since the p⁻-type layer 13 is not provided on the lower surface of the n⁻-type semiconductor substrate 1, the secondary breakdown current flows in the thickness direction of the substrate. Therefore, as the substrate thickness is reduced, the secondary breakdown current is more likely to flow and breakdown resistance decreases.

By contrast, in the present embodiment, the p⁻-type layer 13, which is deeper than the n-type buffer layer 10, is provided on the lower surface of the n⁻-type semiconductor substrate 1 in the termination region. As a result, even when the secondary breakdown current flows locally under the effect of high-energy cosmic rays, a secondary breakdown occurs between the main junction of the cell region of the upper surface of the substrate and the p⁻-type layer 13. Therefore, since the secondary breakdown current flows in the oblique direction across the substrate thickness, the current path becomes longer, negative resistance is unlikely to appear, and the breakdown resistance can be increased.

Second Embodiment

Figure 3:
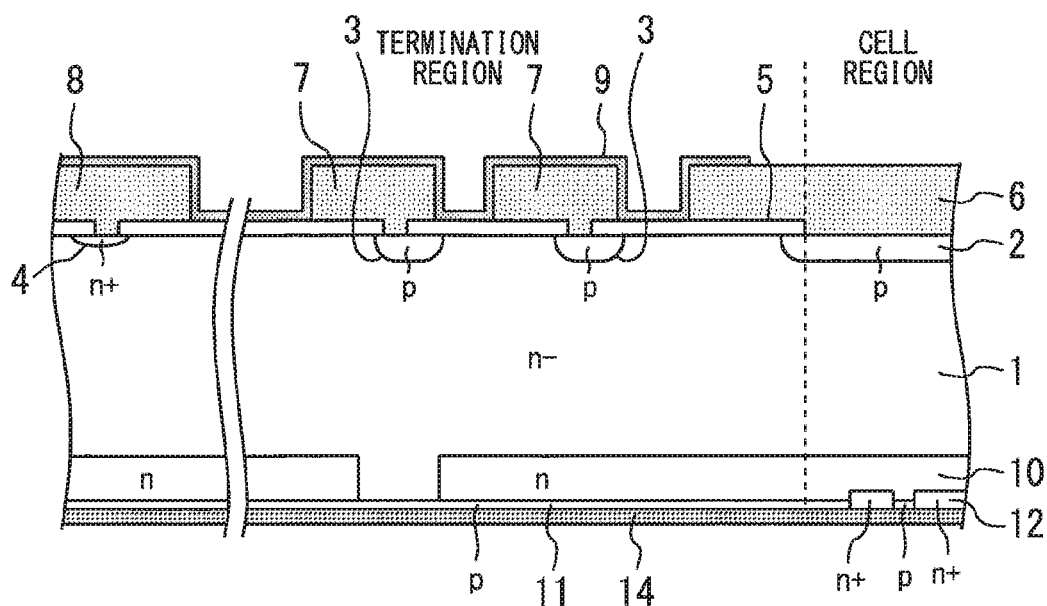
FIG. 3 is a cross-sectional view showing a semiconductor device according to the second embodiment.

FIG. 3 is a cross-sectional view showing a semiconductor device according to the second embodiment. In the present embodiment, a region in which the n-type buffer layer 10 is not formed in the termination region is present instead of the deep p⁻-type layer 13 of the first embodiment. The p-type collector layer 11 which is shallower than the n-type buffer layer 10 is provided in this region. This region is formed by a photolithography process or by using a shielding mask when the n-type buffer layer 10 is formed.

In the present embodiment, a region in which the n-type buffer layer 10 has not been formed is present in the termination region, and the p-type collector layer 11 is provided in this region. As a result, even when the secondary breakdown current flows locally under the effect of high-energy cosmic rays, a secondary breakdown occurs between the main junction of the cell region of the upper surface of the substrate and the region of the termination region of the lower surface of the substrate where the n-type buffer layer 10 is not formed. Therefore, since the secondary breakdown current flows in the oblique direction across the substrate thickness, the current path becomes longer, negative resistance is unlikely to appear, and the breakdown resistance can be increased. Further, by adjusting the width of the region where the n-type buffer layer 10 is not formed, the depth of the n-type buffer layer 10, and the like, it is possible to control the elongation mode of depletion layer, which makes it possible to suppress the concentration of the secondary breakdown current and adjust the flow path of the secondary breakdown current.

Third Embodiment

Figure 4:
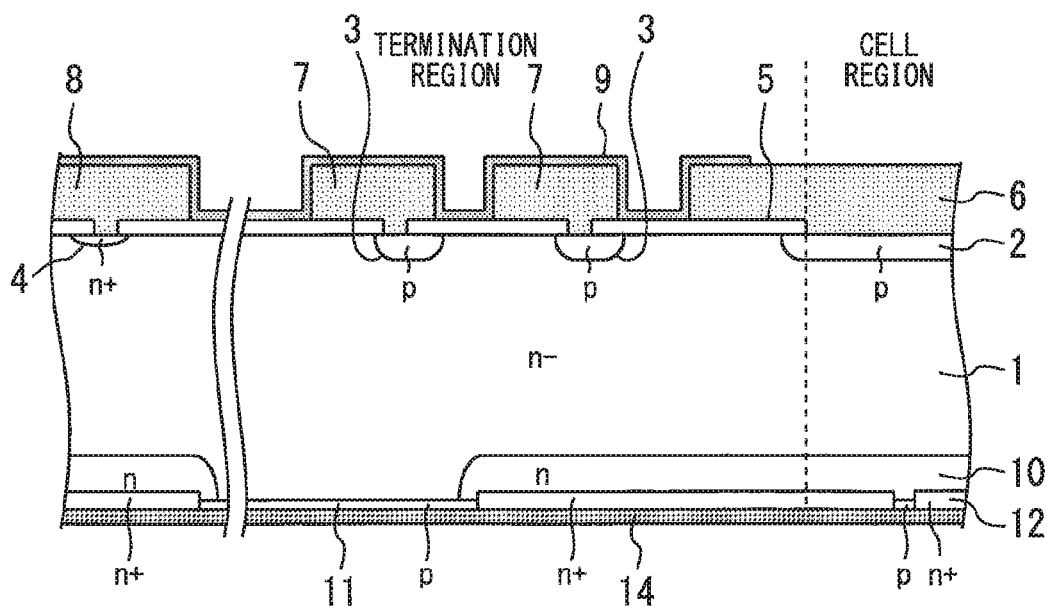
FIG. 4 is a cross-sectional view showing a semiconductor device according to the third embodiment.

FIG. 4 is a cross-sectional view showing a semiconductor device according to the third embodiment. Here, the n⁺-type cathode layer 12 is provided on the lower surface of the n-type buffer layer 10 also in the termination region. As a result, it is possible to suppress an operation effect in which transition to a secondary breakdown state resulting in a breakdown occurs at the same time an avalanche breakdown occurs in static withstand voltage measurement.

The depth of the p-type collector layer 11 from the lower surface of the n⁻-type semiconductor substrate 1 is less than that of the n⁺-type cathode layer 12. A region in which the n-type buffer layer 10 and the n⁺-type cathode layer 12 are not formed is present in the termination region, and the p-type collector layer 11 is provided in this region. As a result, the same effect as that of the second embodiment can be obtained.

Further, the n⁺-type cathode layer 12 is formed by activation performed by applying heat treatment such as laser annealing after ion implantation by using the photolithography pattern same as that used for the n-type buffer layer 10. Therefore, it is not necessary to add a photolithography process or use a shielding mask.

Fourth Embodiment

Figure 5:
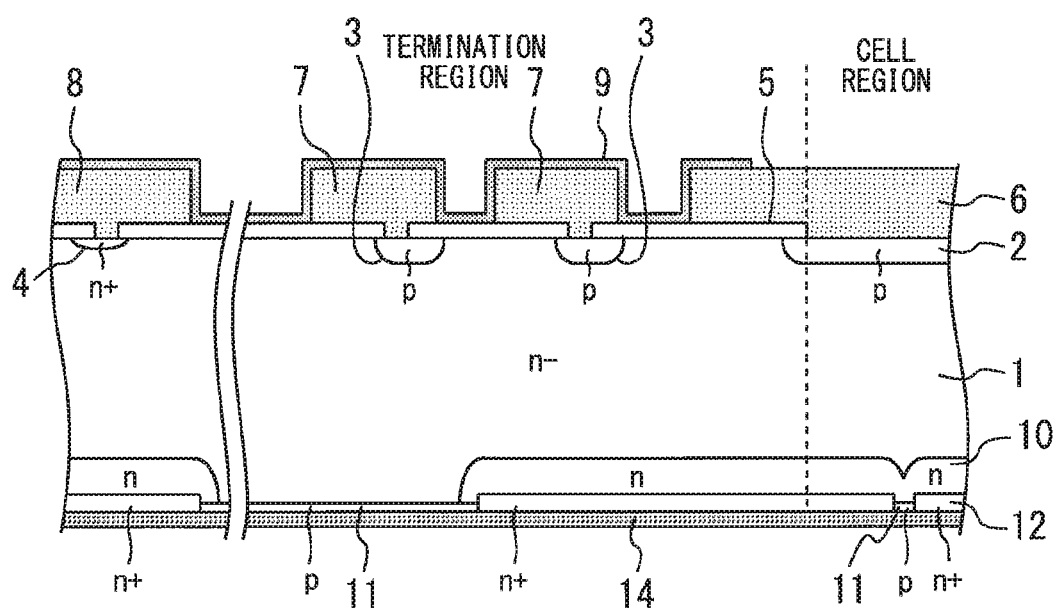
FIG. 5 is a cross-sectional view showing a semiconductor device according to the fourth embodiment.

FIG. 5 is a cross-sectional view showing a semiconductor device according to the fourth embodiment. In the n-type buffer layer 10, toward the center region of the p-type collector layer 11 of the cell region, the concentration of dopant decreases and the depth from the lower surface of the n⁻-type semiconductor substrate 1 is locally reduced. As a result, the hole injection efficiency from the p-type collector layer 11 is increased in the center region of the p-type collector layer 11 of the cell region and lowered in the peripheral region. In the center region of the p-type collector layer 11 of the cell region, the accumulation of carriers during forward operation is small and depletion is likely to occur at the time of recovery. Therefore, by increasing the hole injection efficiency in the center region, it is possible to increase the recovery oscillation resistance. The same effects as in the third embodiment can be also obtained.

Further, since the n-type buffer layer 10 above the p-type collector layer 11 is formed by transverse diffusion from the left and right of the photolithography patter, the impurity concentration in the pattern center is lowered and the depth decreases. Further, by adjusting the width of the photolithography pattern, it is possible to adjust the impurity concentration and depth of the n-type buffer layer 10 above the p-type collector layer 11.

The $n^-$-type semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-189414, filed on Oct. 4, 2018 including specification, claims, drawings and summary, on which the Convention priority of the present application is based, is incorporated herein by reference in its entirety.

The invention claimed is:

1. A semiconductor device comprising:
   an n-type semiconductor substrate having a cell region and a termination region provided around the cell region, the cell region including an anode of a diode or a metal-oxide semiconductor (MOS) structure of an insulated-gate bipolar transistor (IGBT), and the termination region does not include either the anode of the diode or the MOS structure of the IGBT;
   a p-type anode layer provided on an upper surface of the n-type semiconductor substrate in the cell region;
   an n-type buffer layer provided on a lower surface of the n-type semiconductor substrate; and
   a p-type layer provided on the lower surface of the n-type semiconductor substrate in the termination region and deeper than the n-type buffer layer as measured from a bottom of the semiconductor device.

2. The semiconductor device according to claim 1, wherein
   the n-type semiconductor substrate is made of a wide-band-gap semiconductor.

3. A semiconductor device comprising:
   an n-type semiconductor substrate having a cell region and a termination region provided around the cell region, the cell region including an anode of a diode or a metal-oxide semiconductor (MOS) structure of an insulated-gate bipolar transistor (IGBT), and the termination region does not include either the anode of the diode or the MOS structure of the IGBT;
   a p-type anode layer provided on an upper surface of the n-type semiconductor substrate in the cell region;
   an n-type buffer layer provided on a lower surface of the n-type semiconductor substrate; and
   a p-type collector layer provided on the lower surface of the n-type semiconductor substrate and shallower than the n-type buffer layer as measured from a bottom of the semiconductor device, wherein
   the termination region includes a region in which the n-type buffer layer is not provided, and the p-type collector layer is provided in the region, such that the p-type collector layer directly contacts a bottom surface of the semiconductor substrate in the region.

4. The semiconductor device according to claim 3, further comprising
   an n-type cathode layer provided on a lower surface of the n-type buffer layer, wherein
   a depth of the p-type collector layer is less than a depth of the n-type cathode layer,
   the termination region includes a region in which the n-type buffer layer and the n-type cathode layer are not provided, and the p-type collector layer is provided in the region.

5. The semiconductor device according to claim 4, wherein
   in the n-type buffer layer, toward a center region of the p-type collector layer of the cell region, an impurity concentration decreases and a depth is locally reduced.

6. The semiconductor device according to claim 5, wherein
   the n-type semiconductor substrate is made of a wide-band-gap semiconductor.

7. The semiconductor device according to claim 4, wherein
   the n-type semiconductor substrate is made of a wide-band-gap semiconductor.

8. The semiconductor device according to claim 3, wherein
   the n-type semiconductor substrate is made of a wide-band-gap semiconductor.

9. A semiconductor device comprising:
   an n-type semiconductor substrate having a cell region and a termination region provided around the cell region;
   a p-type anode layer provided on an upper surface of the n-type semiconductor substrate in the cell region;
   an n-type buffer layer provided on a lower surface of the n-type semiconductor substrate; and
   a p-type collector layer provided on the lower surface of the n-type semiconductor substrate and shallower than the n-type buffer layer, wherein
   the termination region includes a region in which the n-type buffer layer is not provided, and the p-type collector layer is provided in the region, and
   in the n-type buffer layer, toward a center region of the p-type collector layer of the cell region, an impurity concentration decreases and a depth is locally reduced.

10. The semiconductor device according to claim 9, wherein
    the n-type semiconductor substrate is made of a wide-band-gap semiconductor.

* * * * *